United States Patent
Stirton et al.

(10) Patent No.: US 6,529,282 B1
(45) Date of Patent: Mar. 4, 2003

(54) METHOD OF CONTROLLING PHOTOLITHOGRAPHY PROCESSES BASED UPON SCATTEROMETRIC MEASUREMENTS OF PHOTORESIST THICKNESS, AND SYSTEM FOR ACCOMPLISHING SAME

(75) Inventors: James Broc Stirton, Austin, TX (US); Richard J. Markle, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/879,338

(22) Filed: Jun. 11, 2001

(51) Int. Cl.⁷ .......................... G01B 11/28; H01L 21/76
(52) U.S. Cl. ........................ 356/630; 438/401
(58) Field of Search ................. 356/630, 631, 356/632, 394; 438/401

(56) References Cited

U.S. PATENT DOCUMENTS

| | | | |
|---|---|---|---|
| 5,867,276 A | 2/1999 | McNeil et al. | 356/445 |
| 5,877,880 A | 3/1999 | Borden | 356/376 |
| 5,880,838 A | 3/1999 | Marx et al. | 356/351 |
| 6,051,348 A | 4/2000 | Marinaro et al. | 430/30 |
| 6,081,334 A | 6/2000 | Grimbergen et al. | 356/357 |
| 6,141,107 A * | 10/2000 | Nishi et al. | 250/548 |
| 6,245,584 B1 | 6/2001 | Marinaro et al. | 438/14 |
| 6,383,888 B1 * | 5/2002 | Stirton | 430/22 |
| 6,423,977 B1 * | 7/2002 | Hayasaki et al. | 250/559.19 |

* cited by examiner

Primary Examiner—Georgia Epps
Assistant Examiner—Saeed Seyrafi
(74) Attorney, Agent, or Firm—Williams, Morgan & Amerson, P.C.

(57) ABSTRACT

The present invention is generally directed to a method of controlling photolithography processes based upon scatterometric measurements of photoresist thickness, and system for accomplishing same. In one embodiment, the method comprises providing a library of optical characteristic traces, each of which corresponds to a grating structure comprised of a plurality of photoresist features having a known thickness, forming at least one grating structure in a layer of photoresist, the formed grating structure being comprised of a plurality of photoresist features having an unknown thickness, and illuminating the formed grating structure. The method further comprises measuring light reflected off of the formed grating structure to generate an optical characteristic trace for the formed grating structure, and determining the unknown thickness of the photoresist features by comparing the generated optical characteristic trace to at least one optical characteristic trace from the library.

74 Claims, 6 Drawing Sheets

METHOD OF CONTROLLING PHOTOLITHOGRAPHY PROCESSES BASED UPON SCATTEROMETRIC MEASUREMENTS OF PHOTORESIST THICKNESS, AND SYSTEM FOR ACCOMPLISHING SAME

BACKGROUND OF THE INVENTION

1. Field of the Invention

This invention relates generally to semiconductor fabrication technology, and, more particularly, to a method of controlling photolithography processes based upon scatterometric measurements of photoresist thickness, and system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, metals, insulating materials, etc., and the selective removal of portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.2 $\mu$m (2000 Å), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

Photolithography is a process typically employed in semiconductor manufacturing. Photolithography generally involves forming a layer of photoresist material (positive or negative) above one or more layers of material, e.g., polysilicon, silicon dioxide, that are desired to be patterned. Thereafter, a pattern that is desired to be formed in the underlying layer or layers of material is initially formed in the layer of photoresist using an appropriate stepper tool and known photolithographic techniques, i.e., an image on a reticle in the stepper tool is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

More particularly, in one illustrative embodiment, modern photolithography processes generally involve the steps of: (1) applying a layer of photoresist above a wafer, typically accomplished by a spin-coating process; (2) pre-baking (or soft-baking) the layer of photoresist at a temperature of approximately 90–120° C. to reduce the level of solvents in the layer of photoresist and to improve the adhesion characteristics of the photoresist; (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

However, in the process of forming the layer of photoresist above a wafer, the thickness of the layer of photoresist may vary across the surface of the wafer (within wafer variations) as well as from wafer to wafer (wafer-to-wafer variations). These variations may be localized within a wafer, e.g., the photoresist material formed on an edge region of a wafer may be thicker than the photoresist material in a middle region of the wafer.

Such variations may be the result of a variety of factors. For example, the amount of photoresist initially deposited may vary, the wafer may be rotated at a speed greater or less than the desired rotational speed, the duration of the spinning process may be more or less than anticipated, and the viscosity of the photoresist material may vary as the photoresist material is consumed and replenished. Additionally, variations in cooling of the wafer prior to photoresist application and variations in the pre-exposure bake process may result in the layer of photoresist having unanticipated thickness variations.

Unanticipated thickness variations in the layer of photoresist may adversely affect the ability to produce semiconductor devices having the desired feature size. For example, if the layer of photoresist is thicker than anticipated (either across the wafer or from wafer to wafer), a feature, e.g., a gate electrode, may be formed with a critical dimension greater than anticipated. The critical dimensions may also be smaller than anticipated, depending upon the critical dimension swing curve of the photolithography process. This situation may occur when the exposure process is performed with parameters, e.g., exposure dose, that are intended to be performed on a layer of photoresist having a lesser thickness. Conversely, if the layer of photoresist is thinner than anticipated, the resulting gate electrodes may have a critical dimension that is less than or greater than a targeted critical dimension. All of the identified problems tend to lead to inefficiencies in manufacturing operations and reduce product yields.

The present invention is directed to a method and system that may solve, or at least reduce, some or all of the aforementioned problems.

SUMMARY OF THE INVENTION

The present invention is generally directed to method of controlling photolithography processes based upon scatterometric measurements of photoresist thickness, and system for accomplishing same. In one illustrative embodiment, the method comprises providing a library of optical characteristic traces, each of which corresponds to a grating structure comprised of a plurality of photoresist features having a known thickness, forming at least one grating structure in a layer of photoresist, the formed grating structure being comprised of a plurality of photoresist features having an unknown thickness, and illuminating the formed grating structure. The method further comprises measuring light reflected off of the formed grating structure to generate an optical characteristic trace for the formed grating structure, and determining the unknown thickness of the photoresist features by comparing the generated optical characteristic trace to at least one optical characteristic trace from the library. In a further embodiment, the method comprises modifying at least one parameter of a process used to form a layer of photoresist on a subsequently processed wafer based upon the determined thickness of the photoresist features.

BRIEF DESCRIPTION OF THE DRAWINGS

The invention may be understood by reference to the following description taken in conjunction with the accompanying drawings, in which like reference numerals identify like elements, and in which.

Figure 1:
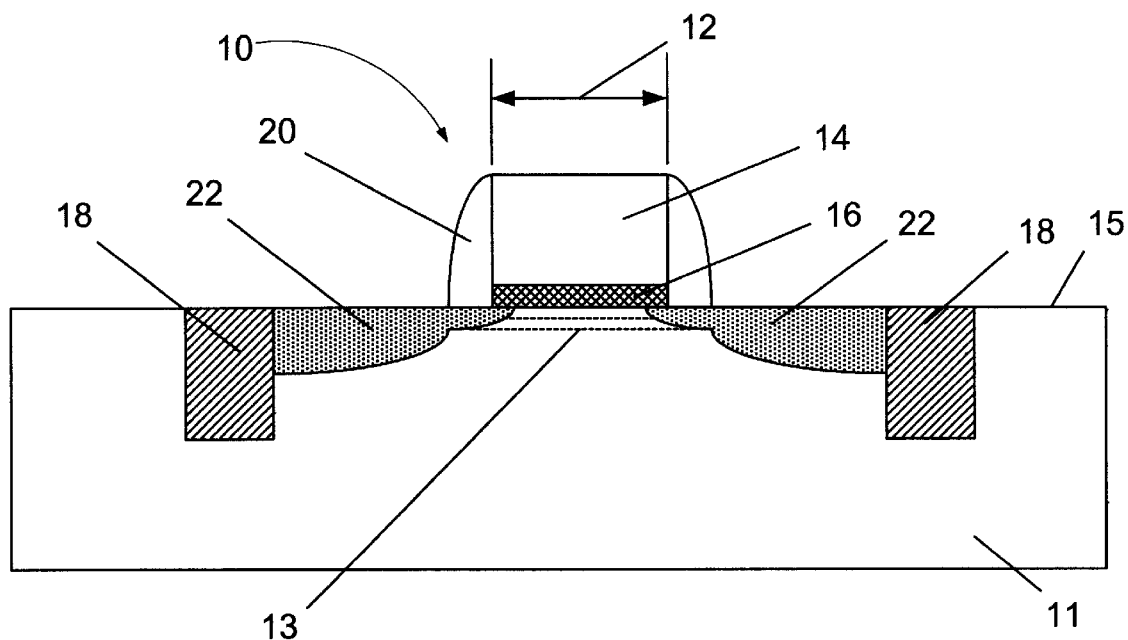
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of controlling photolithography processes based upon scatterometric measurements of photoresist thickness, and system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed using known photolithography and etching techniques until such time as a completed device is formed. Photolithography generally involves forming a patterned layer of photoresist material (positive or negative) above one or more layers of material that are desired to be patterned, and using the patterned photoresist layer as a mask in subsequent etching processes.

More particularly, the pattern desired to be formed in the underlying layer or layers of material is initially formed on a reticle. Thereafter, using an appropriate stepper tool, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer.

Figure 2:
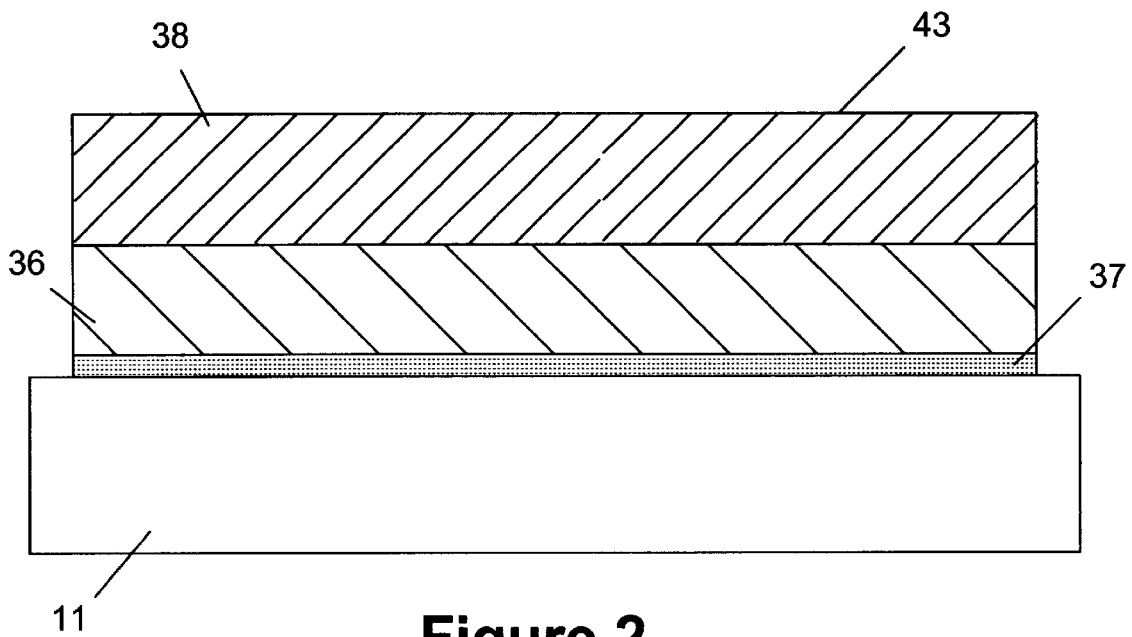
FIG. 2 is a cross-sectional view of a wafer having a plurality of process layers and a layer of photoresist formed thereon.
Figure 3:
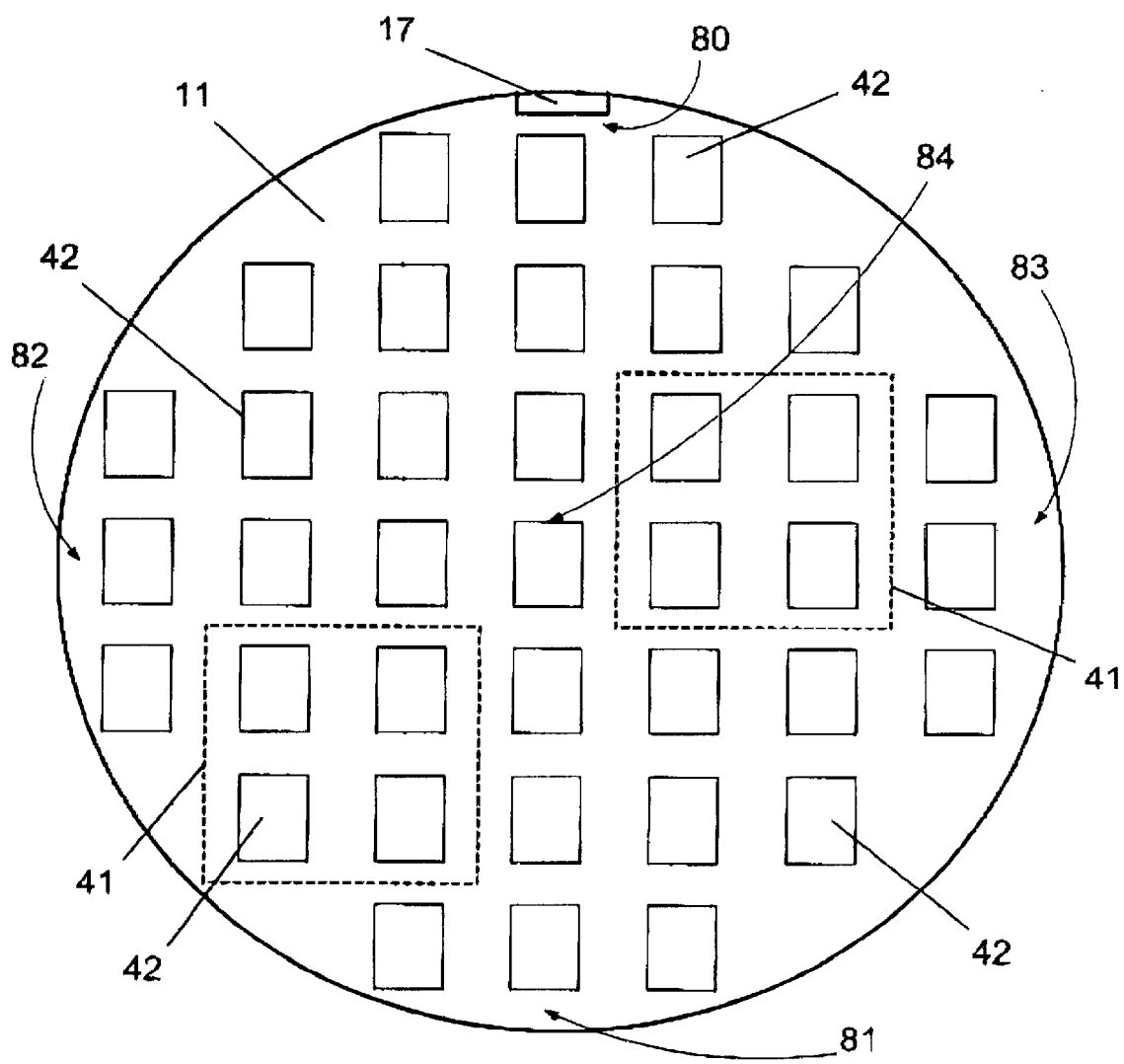
FIG. 3 is a plan view of an illustrative wafer depicting several production die.

FIGS. 2 and 3 depict an illustrative embodiment of a wafer 11 that may be subjected to an exposure process in a stepper tool. In general, the stepper exposure process is performed on a stack comprised of one or more process layers or films and a layer of photoresist. For example, as shown in FIG. 2, such a stack may be comprised of a gate insulation layer 37, a layer of polysilicon 36 and a layer of photoresist 38, all of which are formed above the semiconducting substrate 11. Alternatively, an anti-reflective coating (ARC) layer (not shown) may be positioned above the layer of polysilicon 36 and below the layer of photoresist 38. Of course, such film stacks may be comprised of a vast variety of combinations of process layers and materials.

The various layers depicted in FIG. 2 may be comprised of a variety of materials that are formed to a variety of thicknesses using a variety of production techniques. For example, the gate insulation layer 37 may be comprised of silicon dioxide, it may have a thickness ranging from approximately 1.5–5 nm, and it may be formed by an oxidation process. Similarly, the layer of polysilicon 36 may be formed by a chemical vapor deposition process to a thickness ranging from approximately 1500–4000 nm. An anti-reflective coating layer (not shown), if used, may be comprised of silicon oxynitride, and it may be formed by a deposition process to a thickness ranging from approximately 30–60 nm. The layer of photoresist 38 may be formed by a variety of spin-coating processes to a thickness of approximately 400–1000 nm.

As shown in FIG. 3, a plurality of production die 42 are formed above the wafer 11. The die 42 define an area of the wafer 11 where production integrated circuit devices, e.g., microprocessors, ASICs, memory devices, etc., will be formed. The size, shape and number of die 42 per wafer 11 depend upon the type of device under construction. For example, several hundred die 42 may be formed above an 8-inch diameter wafer 11. The wafer 11 may also have an alignment notch 17 that is used to provide relatively rough alignment of the wafer 11 prior to performing certain processes, e.g., an exposure process in a stepper tool.

A stepper tool contains a light source (not shown) that is used to project light through a reticle (not shown) onto the layer of photoresist 38. Ultimately, the image in the reticle will be transferred to the layer of photoresist 38, and the underlying process layer 36 will be patterned using the patterned layer of photoresist 38 as a mask during one or more subsequent etching processes. The exposure process performed on the wafer 11 is typically performed on a flash-by-flash basis as the wafer 11 is moved, or stepped, relative to the light source within the stepper tool. During each step, the light source projects light onto a given area of the wafer 11, i.e., each flash is projected onto an exposure field 41 (indicated by dashed lines). The size of the exposure field 41, as well as the number of die 42 within each exposure field 41, may vary greatly. For example, an illustrative exposure field 41 is depicted in FIG. 3 wherein four of the die 42 fall within the exposure field 41, i.e., a so-called 2×2 pattern. However, the number of die 42 and size of the exposure field 41 may vary. For example, integrated circuits may be exposed using a 1×2 pattern (covering 2 die), a 5×5 pattern (covering 25 die), etc. The precise pattern of the exposure field 41 may be based upon the product under construction as well as the desires and judgment of the appropriate process engineer.

In general, the present invention involves forming one or more grating structures 60 (see FIG. 4A) in the layer of photoresist 38 and determining the thickness of the layer of photoresist (either globally or locally) based upon scatterometric measurements of the grating structure 60. Moreover, the results obtained using the present inventive methods may be used in controlling one or more process operations used in forming layers of photoresist material on subsequently processed wafers.

Figure 4A:
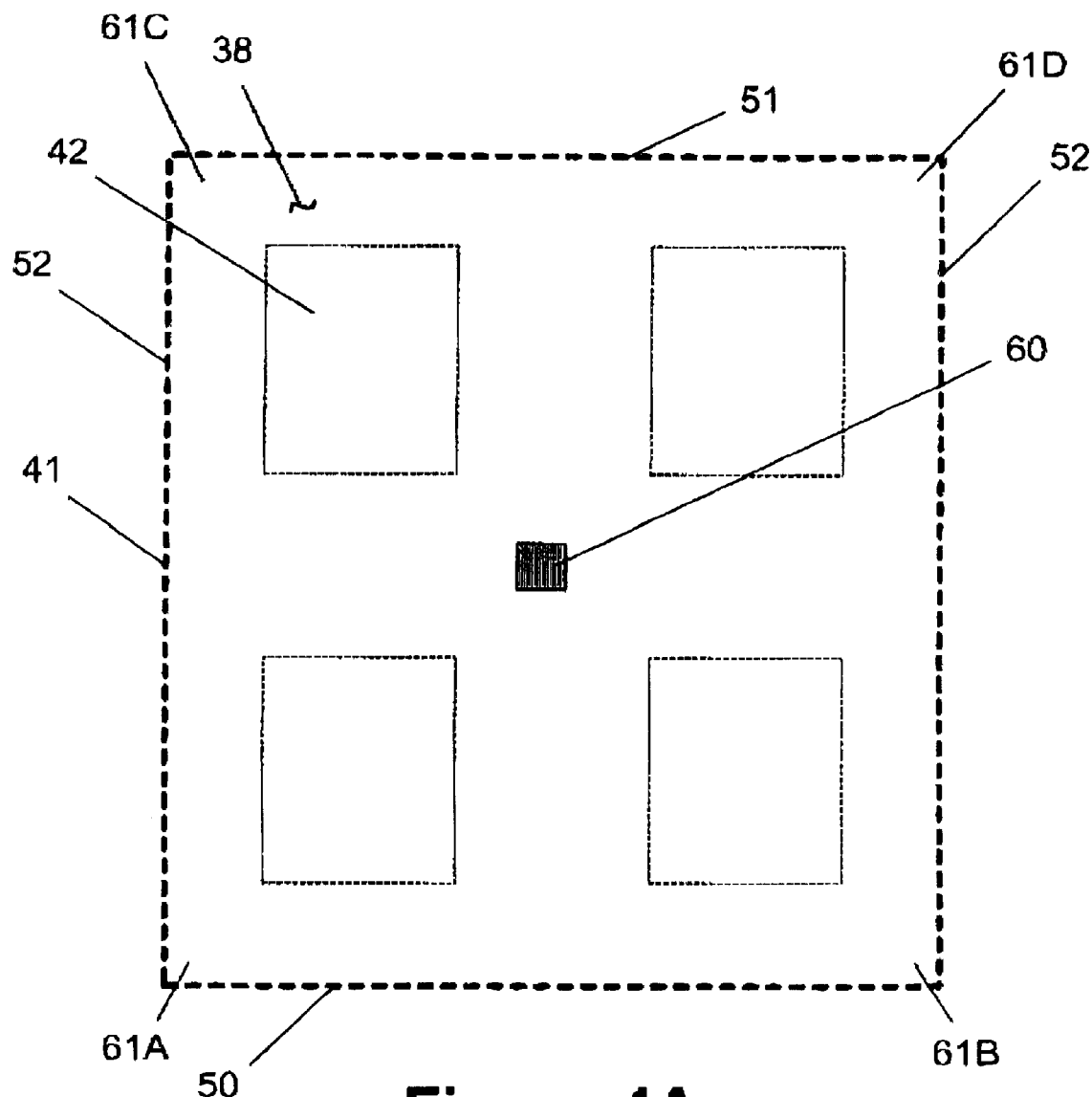
FIGS. 4A–C are illustrative examples wherein at least one grating structure is formed within an area defined by an exposure field of a stepper exposure process.
Figure 4B:
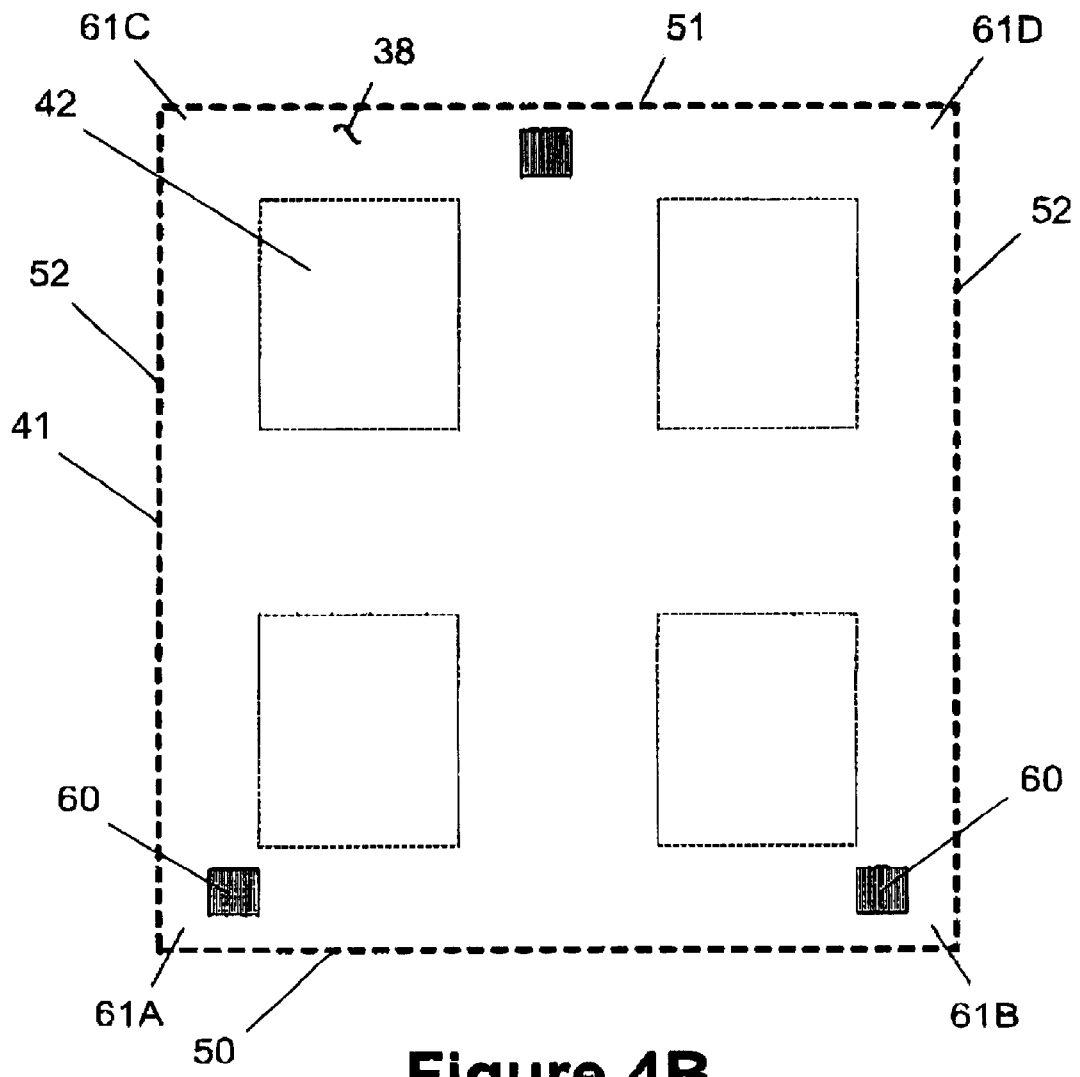

Some aspects of the present invention will now be described with reference to FIGS. 4A–C and 5A–B. FIG. 4A depicts an illustrative exposure field 41 of a stepper exposure process used to expose the layer of photoresist 38 that has been formed above one or more underlying process layers (not shown) that will ultimately be patterned. The particular exposure field 41 depicted in FIG. 4A is defined by a bottom edge 50, a top edge 51, side edges 52 and four corners 61A–D. The depicted exposure field 41 encompasses four die 42 (indicated by dashed lines) formed above the wafer 11. Of course, the size and shape of the exposure field 41 may be varied as a matter of design choice.

According to one embodiment of the present invention, one or more grating structures 60 may be formed within an area defined by the exposure field 41 of a stepper exposure process. Moreover, at least one grating structure 60 may be formed in each of a plurality of the exposure fields 41 of the stepper exposure process across the wafer. For example, one or more grating structures 60 may be formed in the exposure fields 41 of the stepper exposure process that are geographically spread around the wafer 11. That is, in one embodiment, at least one grating structure 60 may be formed in each of at least five exposure fields 41 of the stepper exposure process, wherein the exposure fields 41 may be located near a top region 80, a bottom region 81, side regions 82, 83, and a middle region 84 of the wafer 11. See FIG. 3. Of course, it is not required that there be a grating structure 60 in every exposure field 41, although such an embodiment could be implemented if desired.

The grating structures 60 may be formed at the same time features are being formed in the layer of photoresist 38 that will ultimately be used to define various features in the underlying process layers (not shown) in the area defined by the production die 42. Ultimately, these grating structures 60 will be measured using scatterometric techniques, and these measurements may be used to determine the thickness of the layer of photoresist 38. In further embodiments, these measurements may be used to control one or more parameters of processes used to form a layer of photoresist on a subsequently processed wafer. Normally, these grating structures 60 will be formed in the layer of photoresist 38 above the space between the die 42, i.e., in the area defined by so-called scribe lines. The size of the scribe lines relative to the size of the die 42 in the attached figures is exaggerated for purposes of clarity. Alternatively, assuming there is available plot space, the grating structures 60 may be formed in the area defined by one or more of the die 42.

Figure 4C:
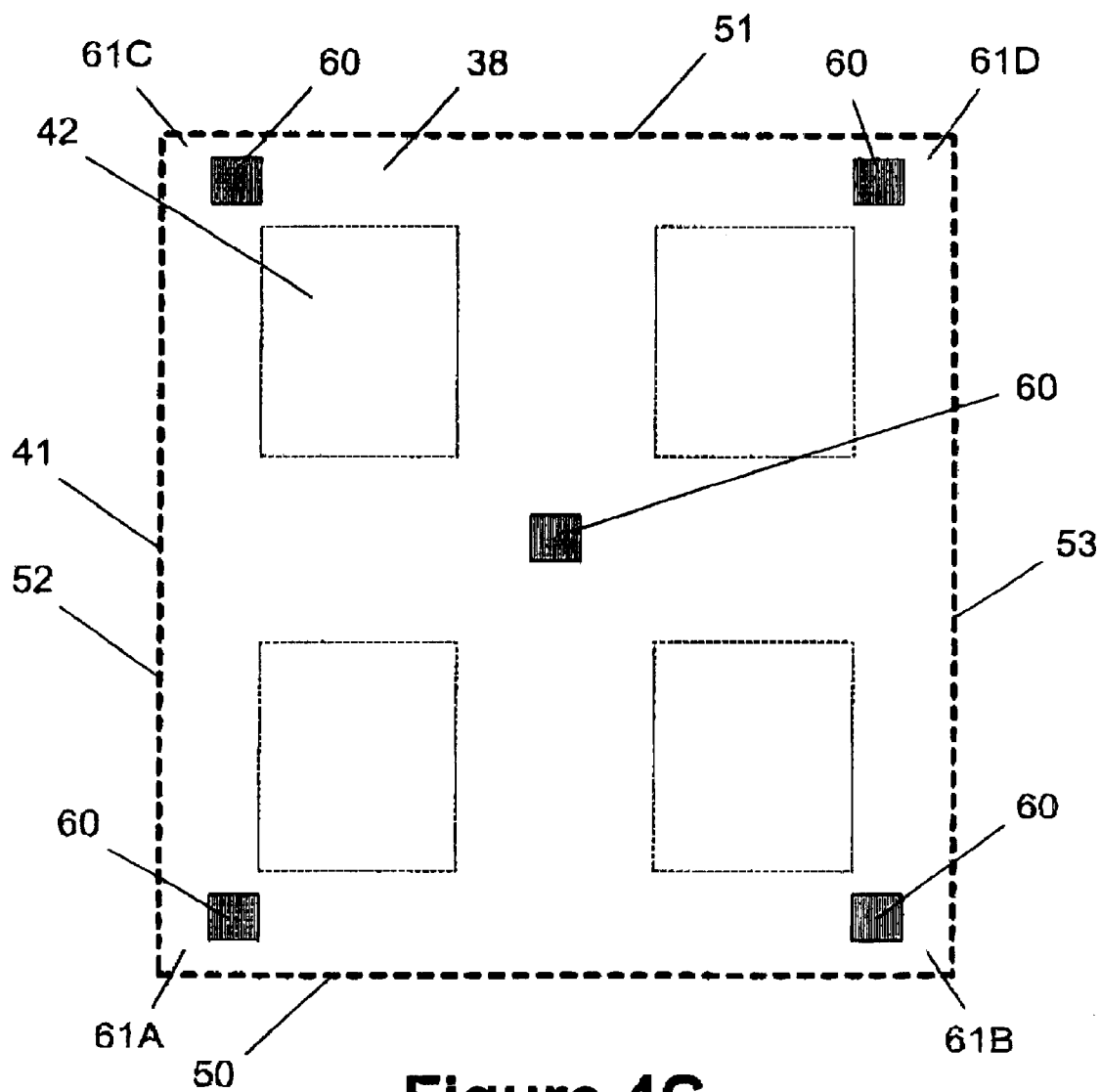

As will be recognized by those skilled in the art after a complete reading of the present application, the size, shape, location and configuration of the grating structures 60 formed in the layer of photoresist 38 may be varied as a matter of design choice. For example, in the embodiment depicted in FIG. 4A, only one grating structure 60 is formed in the layer of photoresist 38 within the exposure field 41. The single grating structure 60 depicted in FIG. 4A is positioned in the approximate middle of the exposure field 41. In the embodiment depicted in FIG. 4B, three grating structures 60 are formed in the layer of photoresist 38 within the exposure field 41. Two of the grating structures 60 are positioned adjacent the bottom corners 61A, 61B of the exposure field 41, and one of the grating structures 60 is positioned adjacent the approximate middle of the top edge 51 of the exposure field 41. FIG. 4C depicts yet another illustrative embodiment of the present invention wherein five grating structures 60 are formed in the exposure field 41. That is, a grating structure 60 is positioned adjacent each corner (61 A–D) of the exposure field 41, and another grating structure 60 is positioned in the approximate middle of the exposure field 41. Of course, as will be recognized by those skilled in the art after a complete reading of the present application, the number and arrangement of the grating structures 60 within an exposure field 41 may be varied as a matter of design choice.

Figure 5A:
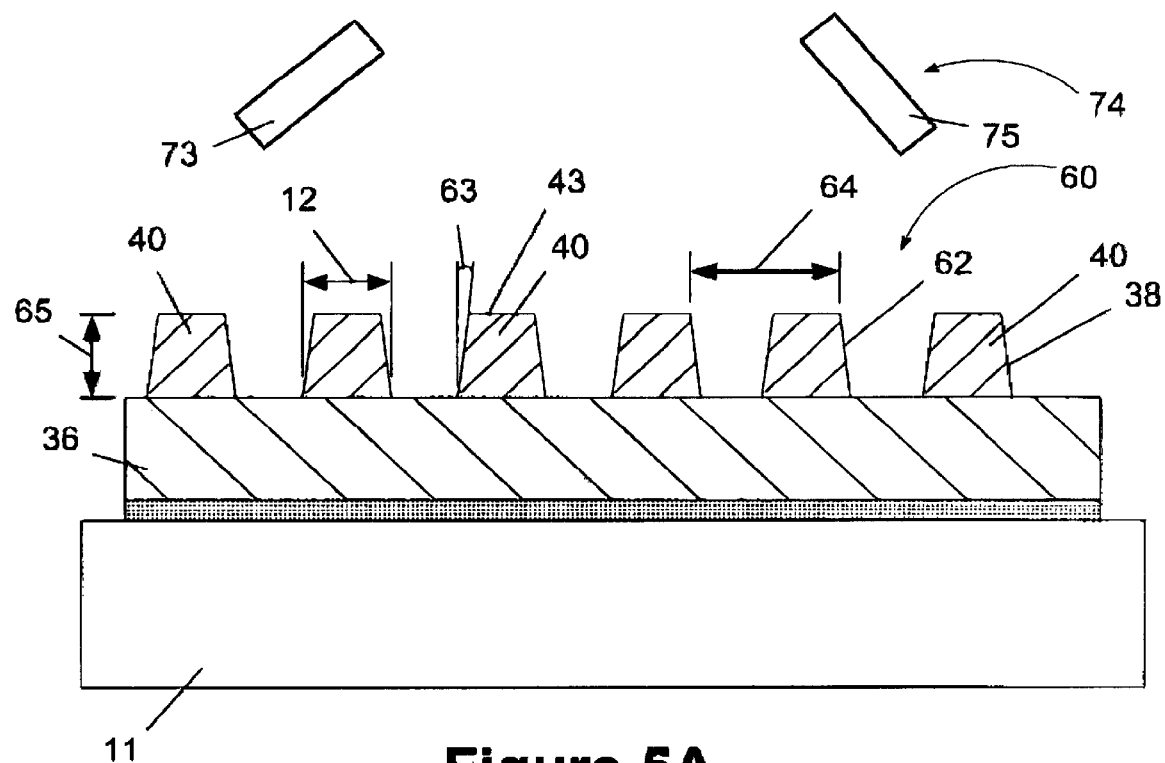
FIGS. 5A–5B depict one illustrative embodiment of a grating structure that may be employed with the present invention.
Figure 5B:
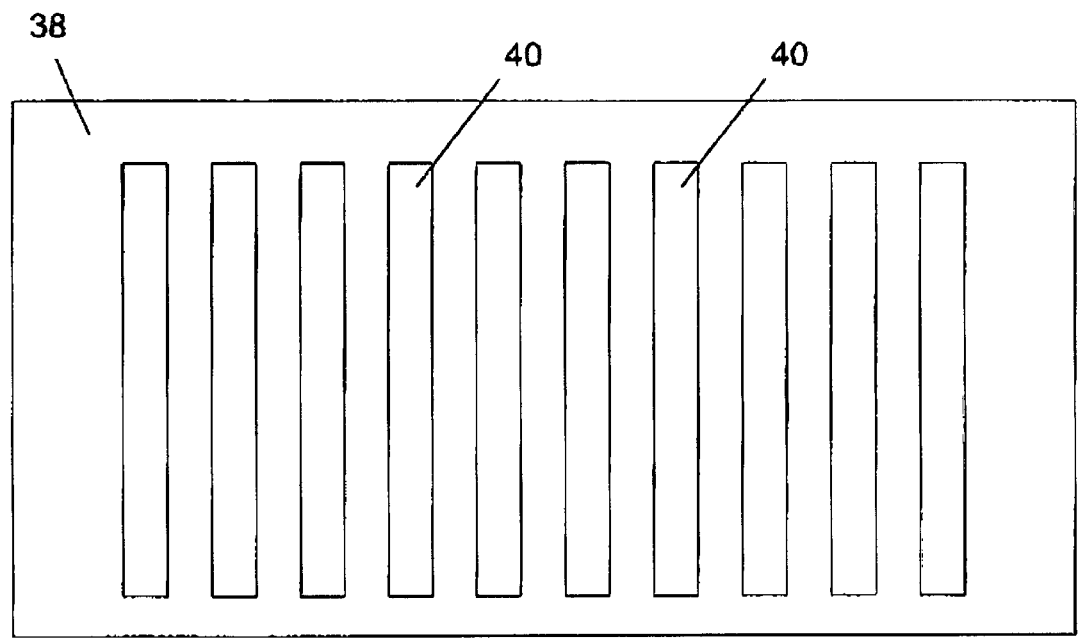

The size, shape, configuration and type of grating structure 60 may be varied as a matter of design choice. For example, the grating structure 60 may be comprised of a plurality of photoresist features, e.g., multiple lines or trenches, formed in the layer of photoresist 38. One such illustrative grating structure 60, depicted in FIGS. 5A–B, is comprised of a plurality of lines 40 formed in the layer of photoresist 38. The lines 40 comprising the grating structure 60 have a thickness 65 and sidewalls 62 disposed at an angle 63 (relative to a line normal to the surface 43 of the layer of photoresist 38). The thickness 65, the sidewall angle 63, and the spacing or pitch 64 between the lines 40 may be varied as a matter of design choice. For example, the grating structure 60 may be formed in regions having approximate dimensions of 100 μm×120 μm, and it may be comprised of approximately 300–400 lines 40 (depending upon the selected pitch). The thickness 65 of the lines 40 will correspond to the thickness of the layer of photoresist 38. The sidewall angle 63 of the lines 40 may vary from approximately 70–100 degrees relative to the horizontal surface of the substrate.

The grating structure 60 may be formed as a separate test structure, or in some embodiments, it may be comprised of photoresist features, e.g., lines, that are used to form actual production devices. For example, the grating structure 60 may be essentially a test structure that is formed in an area defined by a scribe line of a wafer 11. The photoresist features that are part of the grating structure 60 may be formed at the same time that similar photoresist features are being formed for production devices formed on the wafer 11. That is, a pattern for the grating structure 60 may be formed in a reticle that will be used in the process of exposing the layer of photoresist 38 to form production integrated circuit devices within the die 42. Alternatively, a separate reticle may be used wherein only the grating structures 60 are formed in the layer of photoresist 38. This separate reticle may be used before or after the reticle used to expose the production devices is used.

Figure 6:
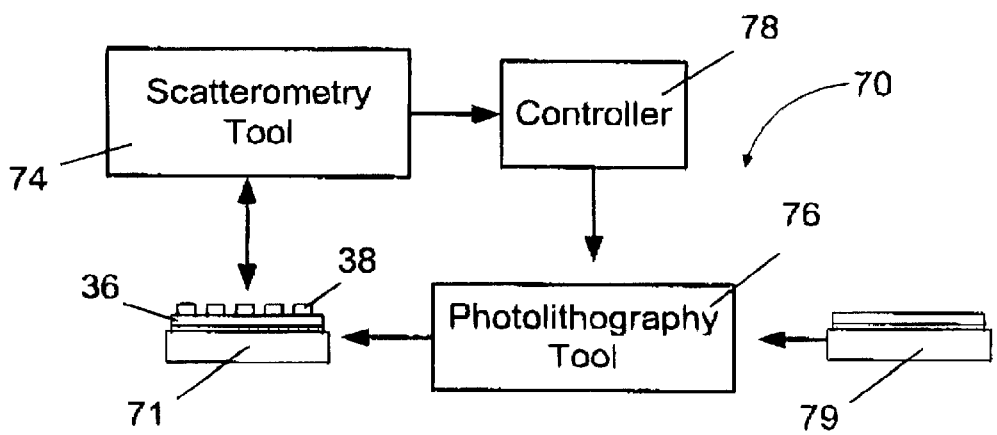
FIG. 6 depicts an illustrative embodiment of a system in accordance with one embodiment of the present invention.

An illustrative system 70 that may be used in one embodiment of the present invention is shown in FIG. 6. The system 70 is comprised of a scatterometry tool 74, a photolithography tool 76, and a controller 78. As indicated in FIG. 6, the wafer 71 is representative of one or more wafers having a film stack comprised of at least one process layer and a layer of photoresist 38 formed thereabove. The wafer 71 is depicted at the point in the process wherein it has previously been processed in the photolithography tool 76. The layer of photoresist 38 on the wafer 71 was subjected to an exposure process in the stepper tool to transfer the features defined in the reticle (not shown) to the layer of photoresist 38. During this process, the grating structures 60 were defined in the layer of photoresist 38, as were many other photoresist features that will be used to ultimately form corresponding features in the underlying process layer 36. Thereafter, a post-exposure bake process may be performed on the layer of photoresist 38. Ultimately, the layer of photoresist 38 will be subjected to a development process whereby soluble portions of the layer of photoresist 38 will be removed. This will result in the definition of a patterned layer of photoresist 38 that reflects the pattern in the reticle used during the exposure process. This patterned layer of photoresist 38 will be used in patterning the underlying process layer by performing one or more known etching processes.

An illustrative scatterometry tool 74 that may be used with the present invention is comprised of a representative light source 73 and a detector 75 depicted in FIG. 5A. Ultimately, the grating structure(s) 60 will be measured using scatterometric techniques, and these measurements will be used to determine the thickness of the photoresist layer 38. The scatterometry measurements of the grating structure 60 may be performed at the layer of photoresist 38 has been subjected to a post-exposure bake process, but prior to the layer of photoresist 38 being subjected to a development process. Alternatively, the scatterometry measurements may be taken after the layer of photoresist 38 has been subjected to a development process.

A variety of scatterometry tools 74 may be used with the present invention, e.g., so-called 2θ-type systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation. The optical characteristic traces generated by the scatterometry tool 74 may be based upon a comparison of light intensity to wavelength (for white light, fixed angle type scatterometry tools) or a comparison of intensity to incident angle (for angle resolved systems that use a single light source).

Through use of scatterometry, an optical characteristic trace for a grating structure 60, associated with a particular thickness of the layer of photoresist 38, may be calculated (using Maxwell's equations) for a grating structure 60 comprised of a vast variety, if not all, anticipated thickness variations in the layer of photoresist 38. These traces may be stored in a library. The scatterometry trace may be based on a variety of characteristics of the photoresist features, e.g., lines or trenches, comprising the grating structure 60. For example, with reference to FIGS. 5A–B, the optical characteristic trace may be based upon the sidewall angle 63 or critical dimension 12 of the photoresist features, i.e., lines 40. Other characteristics may also be used as the basis for the optical characteristic traces.

Variations in the thickness of the layer of photoresist 38 will cause one or more of the characteristics of the photoresist features, e.g., lines 40, of the grating structure 60 to vary. In turn, this will cause a significant change in the diffraction characteristics of the incident light from the light source 73 of the scatterometry tool 74. Thus, using Maxwell's equations, a unique optical characteristic trace may be established for each unique thickness of the layer of photoresist 38 anticipated by the design process. A library of traces corresponding to each anticipated thickness variation may be calculated and stored in a library. Through this technique, each trace in the library represents a grating structure 60 comprised of photoresist features having a known thickness.

The present invention may be employed to correlate or match a measured or generated trace of a grating structure 60 comprised of a plurality of photoresist features having an unknown thickness to a library of such traces, each of which corresponds to a grating structure 60 comprised of features in a layer of photoresist having a known thickness. That is, in one embodiment, the scatterometry tool 74 is used to measure and generate a trace for a given grating structure 60 comprised of a plurality of photoresist features formed in a layer of photoresist having an unknown thickness. The scatterometry tool 74 may measure one or more grating structures 60 in one or more exposure fields 44 on a given wafer. Moreover, the traces from a sample of the grating structures 60 may be averaged or otherwise statistically analyzed. The scatterometry tool 74 (or some other controller resident within the manufacturing plant, e.g., controller 78) compares the measured trace (i.e., individual or averaged) to a library of traces with known thicknesses of the layer of photoresist to correlate or approximately match the current measured trace with a trace in the library. When a match is confirmed, the scatterometry tool 74 (or other controller) may then provide data as to the thickness of the layer of photoresist in the measured grating structure 60.

Based upon these comparisons, the previously unknown thickness of the layer of photoresist comprising the measured grating structure 60 may be determined. Additionally, based upon the determined thickness of the layer of photoresist 38, the controller 78, if needed, may adjust one or more parameters of the processes used to form a layer of photoresist on subsequently processed wafers 79. See FIG. 6. For example, the results of the scatterometric measurement of the thickness of the layer of photoresist 38 may be fed back to the controller 78. In turn, the controller 78 may modify or determine one or more process parameters for forming a layer of photoresist above a subsequently processed wafer. More particularly, the measurements obtained by the scatterometric measurement techniques described herein may be fed back to a controller that controls portions of a wafer "track" of a modem photolithography module. Various parameters may be controlled using the present techniques, e.g., the rotational speed of the wafer during the spin coating process, the duration of the spinning process, the quantity of photoresist material initially deposited on the wafer prior to spinning, the temperature of the cooling process performed on the wafer prior to the application of the photoresist material, and the temperature and duration of the pre-exposure bake process, etc. A variety of other parameters may also be varied.

In another embodiment, the measured or generated trace of the grating structure 60 may be compared to a target trace selected from the library for a grating structure 60 comprised of photoresist features having a known and desired, or acceptable, target thickness. For example, a target trace may be calculated for a grating structure 60 comprised of photoresist features having an ideal or acceptable thickness using Maxwell's equations, and that target trace may be stored in the library. Thereafter, a measured trace of a grating structure 60 comprised of photoresist features having an unknown thickness are compared to the target trace. Based upon this comparison, a relatively rough approximation of the acceptability of the thickness of the layer of photoresist may be determined. That is, by comparing the measured trace to the target trace, it may be determined if the process is producing layers of photoresist 38 having a thickness sufficiently close to a layer of photoresist having an ideal or acceptable thickness such that further matching of the measured trace with an additional trace from the library is unwarranted. Using this technique, an initial determination may be made as to the acceptability of the thickness of the layer of photoresist 38 as compared to a target thickness. Of course, this step may be performed in addition to the matching or correlating of a measured trace to a trace from the library as described above.

Control equations may be employed to adjust the operating recipe of the photolithography tool 76 in situations where the methods described herein indicate that an adjustment is warranted. The control equations may be developed empirically using commonly known linear or non-linear techniques. The controller 78 may automatically control the operating recipes of the photolithography tool 76 used to form a layer of photoresist on the subsequently processed wafers 79. Through use of the present invention, the extent and magnitude of variations in thicknesses of layers of photoresist may be reduced.

In the illustrated embodiments, the controller 78 is a computer programmed with software to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the etch tool 76. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is directed to a method of controlling photolithography processes based upon scatterometric measurements of photoresist thickness, and system for accomplishing same. In one illustrative embodiment, the method comprises providing a library of optical characteristic traces, each of which corresponds to a grating structure 60 comprised of a plurality of photoresist features having a known thickness, forming at least one grating structure 60 in a layer of photoresist 38, the formed grating structure 60 being comprised of a plurality of photoresist features having an unknown thickness, and illuminating the formed grating structure 60. The method further comprises measuring light reflected off of the formed grating structure 60 to generate an optical characteristic trace for the formed grating structure 60, and determining the unknown thickness of the photoresist features by comparing the generated optical characteristic trace to at least one optical characteristic trace from the library. In a further embodiment, the determined thickness is used to modify at least one parameter of a process used to form a layer of photoresist on at least one subsequently processed wafer.

The present invention is also directed to a system for accomplishing the illustrative methods described herein. In one embodiment, the system 70 is comprised of a scatterometry tool 74, a photolithography tool 76 and a controller 78. The scatterometry tool 74 is adapted to make scatterometric measurements of a grating structure 60 comprised of a plurality of photoresist features having an unknown thickness and generate an optical characteristic trace for the grating structure 60. The scatterometry tool 74 may be further used to compare the generated optical characteristic trace to an optical characteristic trace from a library containing a plurality of traces or to correlate or match the generated optical characteristic trace to an optical trace in the library. The controller 78 may then be used to control one or more parameters of one or more processes used the form a layer of photoresist on subsequently processed wafers.

Through use of the present invention, better process control may be achieved in modem integrated circuit manufacturing facilities. Additionally, the present invention may enable more precise formation of gate electrode structures of transistors employed in integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of determining a thickness of a layer of photoresist, comprising:

providing a library of optical characteristic traces, each of which corresponds to a grating structure comprised of a plurality photoresist features having a known thickness;

forming at least one grating structure in a layer of photoresist, said formed grating structure being comprised of a plurality of photoresist features having an unknown thickness;

illuminating said formed grating structure;

measuring light reflected off of said formed grating structure to generate an optical characteristic trace for said formed grating structure; and determining said unknown thickness of said photoresist features by comparing said generated optical characteristic trace to at least one optical characteristic trace from said library.

2. The method of claim 1, further comprising modifying at least one parameter of a process used to form a layer of photoresist on at least one subsequently processed wafer based upon said determined thickness of said photoresist features.

3. The method of claim 1, wherein said at least one formed grating structure is formed within an area defined by a single exposure field of a stepper exposure process.

4. The method of claim 1, wherein forming at least one grating structure in a layer of photoresist comprises forming at least three grating structures in a layer of photoresist.

5. The method of claim 1, wherein forming at least one grating structure in a layer of photoresist comprises forming at least five grating structures in a layer of photoresist.

6. The method of claim 2, wherein modifying at least one parameter of a process used to form a layer of photoresist on at least one subsequently processed wafer comprises modifying at least one of a rotational speed of a wafer during a spin coating process, a duration of a spin coating process, a quantity of a photoresist material initially deposited on a wafer prior to performing a spin coating process, a temperature of a cooling process performed on a wafer prior to application of a photoresist material to the wafer, a temperature of a pre-exposure bake process, and a duration of a pre-exposure bake process of a wafer for at least one subsequently processed wafer.

7. The method of claim 1, wherein said photoresist features comprising said grating structure are comprised of lines or trenches.

8. The method of claim 1, wherein measuring light reflected off of said at least one grating structure to generate an optical characteristic trace for said grating structure is performed after said layer of photoresist has been subjected to a post-exposure bake process and prior to said layer of photoresist being subjected to a development process.

9. The method of claim 1, wherein measuring light reflected off of said at least one grating structure to generate an optical characteristic trace for said grating structure is performed after said layer of photoresist is subjected to a development process.

10. The method of claim 1, wherein forming at least one grating structure in a layer of photoresist, said formed grating structure being comprised of a plurality of photoresist features having an unknown thickness comprises forming at least one grating structure in a layer of photoresist in each of a plurality of exposure fields of a stepper exposure process, said formed grating structure being comprised of a plurality of photoresist features having an unknown thickness.

11. The method of claim 1, wherein forming at least one grating structure in a layer of photoresist, said formed grating structure being comprised of a plurality of photoresist features having an unknown thickness comprises forming at least one grating structure in a layer of photoresist in each of at least five exposure fields of a stepper exposure process, said formed grating structure being comprised of a plurality of photoresist features having an unknown thickness.

12. The method of claim 10, wherein forming at least one grating structure comprises forming at least three grating structures.

13. The method of claim 10, wherein forming at least one grating structure comprises forming at least five grating structures.

14. The method of claim 11, wherein forming at least one grating structure comprises forming at least three grating structures.

15. The method of claim 11, wherein forming at least one grating structure comprises forming at least five grating structures.

16. A method, comprising:
providing a library of optical characteristic traces, each of which corresponds to a grating structure comprised of a plurality of photoresist features having a known thickness;
forming at least one grating structure in a layer of photoresist in each of a plurality of exposure fields of a stepper exposure process, said formed grating structure being comprised of a plurality of photoresist features having an unknown thickness;
illuminating said formed grating structure;
measuring light reflected off of said formed grating structure to generate an optical characteristic trace for said formed grating structure;
determining said unknown thickness of said photoresist features by comparing said generated optical characteristic trace to at least one optical characteristic trace from said library; and
modifying at least one parameter of a process used to form a layer of photoresist on at least one subsequently processed wafer based upon said comparison of said generated optical characteristic trace and said at least one optical characteristic trace from said library.

17. The method of claim 16, wherein forming at least one grating structure in a layer of photoresist comprises forming at least three grating structures in a layer of photoresist.

18. The method of claim 16, wherein forming at least one grating structure in a layer of photoresist comprises forming at least five grating structures in a layer of photoresist.

19. The method of claim 16, wherein modifying at least one parameter of a process used to form a layer of photoresist on at least one subsequently processed wafer comprises modifying at least one of a rotational speed of a wafer during a spin coating process, a duration of a spin coating process, a quantity of a photoresist material initially deposited on a wafer prior to performing a spin coating process, a temperature of a cooling process performed on a wafer prior to application of a photoresist material to the wafer, a temperature of a pre-exposure bake process, and a duration of a pre-exposure bake process of a wafer for at least one subsequently processed wafer.

20. The method of claim 16, wherein said photoresist features comprising said grating structure are comprised of lines or trenches.

21. The method of claim 16, wherein forming at least one grating structure in a layer of photoresist comprises forming at least one grating structure in a layer of photoresist, one of which is formed in an approximate middle of said exposure field.

22. The method of claim 16, wherein each of said plurality of exposure fields is defined by a top edge, a bottom edge, a plurality of side edges and four corners.

23. The method of claim 16, wherein forming at least one grating structure in a layer of photoresist comprises forming at least five grating structures in a layer of photoresist, one of said grating structures being positioned at approximately a middle of said exposure field, and each of four of said grating structures being positioned proximate a corner of said exposure field.

24. The method of claim 16, wherein measuring light reflected off of said at least one grating structure to generate an optical characteristic trace for said grating structure is performed after said layer of photoresist has been subjected to a post-exposure bake process and prior to said layer of photoresist being subjected to a development process.

25. The method of claim 16, wherein measuring light reflected off of said at least one grating structure to generate an optical characteristic trace for said grating structure is performed after said layer of photoresist is subjected to a development process.

26. The method of claim 16, wherein forming at least one grating structure in a layer of photoresist in each of a plurality of exposure fields of a stepper exposure process, said formed grating structure being comprised of a plurality of photoresist features having an unknown thickness comprises forming at least one grating structure in a layer of photoresist in each of at least five exposure fields of a stepper exposure process, said formed grating structure being comprised of a plurality of photoresist features having an unknown thickness.

27. The method of claim 26, wherein forming at least one grating structure comprises forming at least three grating structures.

28. A method, comprising:
providing a library of optical characteristic traces, each of which corresponds to a grating structure comprised of a plurality of photoresist features having a known thickness;
forming at least one grating structures in a layer of photoresist in each of at least five exposure fields of a stepper exposure process, each of said formed grating structures being comprised of a plurality of photoresist features having an unknown thickness;
illuminating said formed grating structures;
measuring light reflected off of each of said plurality of formed grating structures to generate an optical characteristic trace for each of said plurality of formed grating structures;
determining said unknown thickness of said photoresist features by comparing each of said generated optical characteristic traces to at least one optical characteristic trace from said library; and
modifying at least one parameter of a process used to form a layer of photoresist on at least one subsequently processed wafer based upon said comparison of said generated optical characteristic traces and said at least one optical characteristic trace from said library.

29. The method of claim 28, wherein forming at least one grating structure in a layer of photoresist comprises forming at least three grating structures in a layer of photoresist.

30. The method of claim 28, wherein forming at least one grating structure in a layer of photoresist comprises forming at least five grating structures in a layer of photoresist.

31. The method of claim 28, wherein modifying at least one parameter of a process used to form a layer of photoresist on at least one subsequently processed wafer comprises modifying at least one of a rotational speed of a wafer during a spin coating process, a duration of a spin coating process, a quantity of a photoresist material initially deposited on a wafer prior to performing a spin coating process, a temperature of a cooling process performed on a wafer prior to application of a photoresist material to the wafer, a temperature of a pre-exposure bake process, and a duration of a pre-exposure bake process of a wafer for at least one subsequently processed wafer.

32. The method of claim 28, wherein said photoresist features comprising said grating structure are comprised of lines or trenches.

33. The method of claim 28, wherein at least one of said grating structures is formed proximate a middle of each of said exposure fields.

34. The method of claim 28, wherein each of said exposure fields is defined by a top edge, a bottom edge, a plurality of said edges and four corners.

35. The method of claim 34, wherein forming at least one grating structure in a layer of photoresist comprises forming at least three grating structures in a layer of photoresist, one of said grating structures being positioned proximate said top edge of each of said exposure fields, and each of two of said grating structures being positioned adjacent a corner adjacent said bottom edge of each of said exposure fields.

36. The method of claim 34, wherein forming at least one grating structure in a layer of photoresist comprises forming at least five grating structures in a layer of photoresist, one of said grating structures being positioned at approximately a middle of each of said exposure fields, and each of four of said grating structures being positioned proximate a corner of each of said exposure fields.

37. The method of claim 28, wherein measuring light reflected off of said at least one grating structure to generate an optical characteristic trace for said grating structure is performed after said layer of photoresist has been subjected to a post-exposure bake process and prior to said layer of photoresist being subjected to a development process.

38. The method of claim 28, wherein measuring light reflected off of said at least one grating structure to generate an optical characteristic trace for said grating structure is performed after said layer of photoresist is subjected to a development process.

39. A method, comprising:
providing a wafer having at least one process layer and a layer of photoresist formed thereabove;
forming at least one grating structure in said layer of photoresist;
illuminating said formed grating structures;
measuring light reflected off of said formed grating structure to generate an optical characteristic trace for said formed grating structure;
comparing the generated optical characteristic trace for said formed grating structure to a target optical characteristic trace; and
determining, based upon a comparison of said generated optical characteristic trace and said target optical characteristic trace, at least one parameter of a process to be performed to form a layer of photoresist on a subsequently processed wafer.

40. The method of claim 39, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

41. The method of claim 39, wherein forming at least one grating structure in said layer of photoresist comprises forming at least one grating structure in said layer of photoresist within an area defined by a single exposure field of a stepper exposure process.

42. The method of claim 39, wherein forming at least one grating structure in said layer of photoresist comprises forming at least three grating structures in said layer of photoresist.

43. The method of claim 39, wherein forming at least one grating structure in said layer of photoresist comprises forming at least five grating structures in said layer of photoresist.

44. The method of claim 39, wherein forming at least one grating structure in said layer of photoresist comprises forming at least three grating structures in said layer of photoresist within an area defined by a single exposure field of a stepper exposure process.

45. The method of claim 39, wherein forming at least one grating structure in said layer of photoresist comprises forming at least five grating structures in said layer of photoresist within an area defined by a single exposure field of a stepper exposure process.

46. The method of claim 39, wherein forming at least one grating structure in said layer of photoresist comprises forming at least one grating structure in said layer of photoresist within an area defined by a single exposure field of a stepper exposure process, one of said grating structures being formed proximate a middle of said exposure field.

47. The method of claim 39, wherein measuring light reflected off of said at least one grating structure to generate an optical characteristic trace for said grating structure is performed after said layer of photoresist has been subjected to a post-exposure bake process and prior to said layer of photoresist being subjected to a development process.

48. The method of claim 39, wherein measuring light reflected off of said at least one grating structure to generate an optical characteristic trace for said grating structure is performed after said layer of photoresist is subjected to a development process.

49. The method of claim 39, further comprising modifying, based upon a comparison of said generated optical characteristic trace and said target optical characteristic trace, at least one parameter of a process used to form a layer of photoresist on a subsequently processed wafer.

50. The method of claim 39, wherein modifying at least one parameter of a process used to form a layer of photoresist on at least one subsequently processed wafer comprises modifying at least one of a rotational speed of a wafer during a spin coating process, a duration of a spin coating process, a quantity of a photoresist material initially deposited on a wafer prior to performing a spin coating process, a temperature of a cooling process performed on a wafer prior to application of a photoresist material to the wafer, a temperature of a pre-exposure bake process, and a duration of a pre-exposure bake process of a wafer for at least one subsequently processed wafer.

51. The method of claim 39, wherein measuring the reflected light comprises measuring the intensity of the reflected light.

52. The method of claim 39, wherein forming at least one grating structure in said layer of photoresist comprises forming at least one grating structure in a layer of photoresist in each of a plurality of exposure fields of a stepper exposure process.

53. The method of claim 39, wherein forming at least one grating structure in said layer of photoresist comprises forming at least one grating structure in a layer of photoresist in each of at least five exposure fields of a stepper exposure process.

54. A method, comprising:
providing a wafer having at least one process layer and a layer of photoresist formed thereabove;
forming at least one grating structure in said layer of photoresist in each of a plurality of exposure fields of a stepper exposure process;
illuminating said formed grating structure;
measuring light reflected off of said formed grating structure to generate an optical characteristic trace for said formed grating structure;
comparing the generated optical characteristic trace for said formed grating structure to a target optical characteristic trace; and
determining, based upon a comparison of said generated optical characteristic trace and said target optical characteristic trace, at least one parameter of a process to be performed to form a layer of photoresist on a subsequently processed wafer.

55. The method of claim 54, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

56. The method of claim 54, wherein forming at least one grating structure in said layer of photoresist comprises forming at least three grating structures in said layer of photoresist.

57. The method of claim 54, wherein forming at least one grating structure in said layer of photoresist comprises forming at least five grating structures in said layer of photoresist.

58. The method of claim 54, wherein forming at least one grating structure in said layer of photoresist in each of a plurality of exposure fields of a stepper exposure process comprises forming at least one grating structure in said layer of photoresist in each of a plurality of exposure fields of a stepper exposure process, one of said grating structures being formed proximate a middle of each of said exposure fields.

59. The method of claim 54, wherein measuring light reflected off of said at least one grating structure to generate an optical characteristic trace for said grating structure is performed after said layer of photoresist has been subjected to a post-exposure bake process and prior to said layer of photoresist being subjected to a development process.

60. The method of claim 54, wherein measuring light reflected off of said at least one grating structure to generate an optical characteristic trace for said grating structure is performed after said layer of photoresist is subjected to a development process.

61. The method of claim 54, further comprising modifying, based upon a comparison of said generated optical characteristic trace and said target optical characteristic trace, at least one parameter of a process used to form a layer of photoresist on a subsequently processed wafer.

62. The method of claim 61, wherein modifying at least one parameter of a process used to form a layer of photoresist on at least one subsequently processed wafer comprises modifying at least one of a rotational speed of a wafer during a spin coating process, a duration of a spin coating process, a quantity of a photoresist material initially deposited on a wafer prior to performing a spin coating process, a temperature of a cooling process performed on a wafer prior to application of a photoresist material to the wafer, a temperature of a pre-exposure bake process, and a duration of a pre-exposure bake process of a wafer for at least one subsequently processed wafer.

63. The method of claim 54, wherein measuring the reflected light comprises measuring the intensity of the reflected light.

64. The method of claim 54, wherein forming at least one grating structure in said layer of photoresist in each of a plurality of exposure fields of a stepper exposure process comprises forming at least one grating structure in said layer of photoresist in each of at least five exposure fields of a stepper exposure process.

65. The method of claim 54, wherein forming at least one grating structure comprises forming at least three grating structures.

66. A method, comprising:
providing a wafer having at least one process layer and a layer of photoresist formed thereabove;
forming at least one grating structure in said layer of photoresist in each of at least five exposure fields of a stepper exposure process;
illuminating said formed grating structure;
measuring light reflected off of said formed grating structure to generate an optical characteristic trace for said formed grating structure;
comparing the generated optical characteristic trace for said formed grating structure to a target optical characteristic trace; and
modifying, based upon a comparison of said generated optical characteristic trace and said target optical characteristic trace, at least one parameter of a process to be performed to form a layer of photoresist on a subsequently processed wafer.

67. The method of claim 66, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

68. The method of claim 66, wherein forming at least one grating structure in said layer of photoresist comprises forming at least three grating structures in said layer of photoresist.

69. The method of claim 66, wherein forming at least one grating structure in said layer of photoresist comprises forming at least five grating structures in said layer of photoresist.

70. The method of claim 66, wherein forming at least one grating structure in said layer of photoresist comprises forming at least one grating structure in said layer of photoresist proximate a middle of each of said exposure fields.

71. The method of claim 66, wherein measuring light reflected off of said formed grating structure to generate an optical characteristic trace for said grating structure is performed after said layer of photoresist has been subjected to a post-exposure bake process and prior to said layer of photoresist being subjected to a development process.

72. The method of claim 66, wherein measuring light reflected off of said formed grating structure to generate an optical characteristic trace for said grating structure is performed after said layer of photoresist is subjected to a development process.

73. The method of claim 66, wherein forming at least one grating structure in a layer of photoresist in each of a plurality of exposure fields of a stepper exposure process, said formed grating structure being comprised of a plurality of photoresist features having an unknown thickness comprises forming at least one grating structure in a layer of photoresist in each of at least five exposure fields of a stepper exposure process, said formed grating structure being comprised of a plurality of photoresist features having an unknown thickness.

74. The method of claim 66, wherein forming at least one grating structure comprises forming at least three grating structures.

* * * * *